United States Patent
Usuda

(10) Patent No.: US 7,259,501 B2
(45) Date of Patent: Aug. 21, 2007

(54) PIEZOELECTRIC OSCILLATOR AND ELECTRONIC DEVICE

(75) Inventor: Toshiya Usuda, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 128 days.

(21) Appl. No.: 11/142,473

(22) Filed: Jun. 2, 2005

(65) Prior Publication Data

US 2005/0269911 A1 Dec. 8, 2005

(30) Foreign Application Priority Data

Jun. 3, 2004 (JP) ............................. 2004-165782

(51) Int. Cl.
*H01L 41/053* (2006.01)

(52) U.S. Cl. ..................................... 310/344; 310/348

(58) Field of Classification Search ................ 310/340, 310/344, 348
See application file for complete search history.

(56) References Cited

U.S. PATENT DOCUMENTS

| | | | | |
|---|---|---|---|---|
| 4,471,259 A | * | 9/1984 | Stoermer et al. | 310/353 |
| 5,459,368 A | * | 10/1995 | Onishi et al. | 310/313 R |
| 5,828,159 A | * | 10/1998 | Miyagawa et al. | 310/340 |
| 6,458,734 B1 | * | 10/2002 | Sugimoto et al. | 501/139 |
| 6,642,167 B1 | * | 11/2003 | Sugimoto et al. | 501/138 |
| 6,674,221 B2 | * | 1/2004 | Funahara et al. | 310/348 |
| 6,734,605 B2 | * | 5/2004 | Kinoshita | 310/348 |
| 2001/0016251 A1 | * | 8/2001 | Sugimoto | 428/209 |
| 2002/0039056 A1 | * | 4/2002 | Kawachi et al. | 333/193 |
| 2002/0140322 A1 | * | 10/2002 | Suga et al. | 310/348 |

FOREIGN PATENT DOCUMENTS

JP  A-2000-077943  3/2000

* cited by examiner

*Primary Examiner*—Thomas M. Dougherty
(74) *Attorney, Agent, or Firm*—Oliff & Berridge, PLC

(57) ABSTRACT

A piezoelectric oscillator includes: a package having a package base, a bottom surface, a conductive cap that seals airtightly an interior space of the package base, and a terminal to perform at least one of inputting a signal from outside of the package and outputting a signal from the outside of the package. The piezoelectric oscillator also includes a piezoelectric oscillating piece disposed in the package and an electronic part disposed in the package. The conductive cap is coupled to the terminal to perform at least one of the inputting of the signal from the outside of the package and the outputting of the signal to the outside of the package. The terminal is provided on the electronic part and a plurality of mounting terminals are provided on the bottom surface of the package and are electrically coupled to the electronic part.

8 Claims, 4 Drawing Sheets

PIEZOELECTRIC OSCILLATOR AND ELECTRONIC DEVICE

This application claims the benefit of Japanese Patent Application No. 2004-165782 filed Jun. 3, 2004. The entire disclosure of the prior application is hereby incorporated by reference herein in its entirety.

BACKGROUND

The exemplary embodiments relate to a piezoelectric oscillator and an electronic device, especially a piezoelectric oscillator that is available to input data into a programmable piezoelectric oscillator and a temperature compensated piezoelectric oscillator, as well as an electronic device that is mounted with the above piezoelectric oscillator inside.

A temperature compensated piezoelectric oscillator that is mounted, inside a package, with an electronic part having a control function, such as a temperature compensating function, a PLL function, etc., as well as a programmable piezoelectric oscillator, are required to rewrite the data (information) of the electronic part from outside of the package according to need. Therefore, a terminal to write data for controlling the behavior of the electronic part needs to be provided outside the package that configures the oscillator.

A related art method writes data into an electronic part with a terminal that is provided on the back surface of a package. This terminal is provided in addition to a basic function terminal (mounting terminal) that mounts the piezoelectric oscillator on an electronic device, etc. However, a piezoelectric oscillator that is configured with a data writing terminal on the back surface of a package is subject to the following problems. First, since the number of terminals to be provided within a specified area is increasing, the surface area of a mounting terminal for mounting a piezoelectric oscillator on a substrate needs to be reduced. However, the reduction of the surface area of a mounting terminal is limited in terms of mounting strength and conduction between the terminal and the mounting substrate. Second, in the case where the data stored in the electronic part needs to be rewritten due to a change of specification, etc., occurring after mounting the piezoelectric oscillator on a substrate, the data stored in the electronic part cannot be rewritten unless the piezoelectric oscillator is removed from the substrate.

Another piezoelectric oscillator addresses or solves the above by placing a data writing terminal on the side of a package. For example, a piezoelectric oscillator according to a related art example is described below. The piezoelectric oscillator according to the related art example has a package configured by laminating ceramic substrates, a piezoelectric resonator element and an IC chip being mounted on the substrates. Further, an external terminal for writing control data into the IC chip is provided on the side of the package. The package is described in detail below.

The piezoelectric oscillator has a package in which spaces are formed, each one being formed above and below the laminated substrate, which serves as a partition, for the purpose of mounting either the piezoelectric resonator element or the IC chip. In the package having the above configuration, the laminated substrate includes four layers and the external terminal to write data into the IC chip is provided on the periphery (periphery in the longitudinal direction of the substrate) of the two substrate layers sandwiched between the top and the bottom layers. With such a configuration, it is envisioned there will be no or substantially no data loss or data alteration due to the short circuit between the external terminal for data writing and the mounting terminal, or a contact between the external terminal and a pattern formed on the mounting substrate of an electronic device, ect. For example, see Japanese Unexamined Patent Publication No. 2000-77943.

With the piezoelectric oscillator according to the related art example, the data on the IC chip can be rewritten, even after the piezoelectric oscillator is mounted on a substrate and the chance of the short circuit with the mounting terminal and the pattern placed on the mounting substrate of an electronic device, etc., will be reduced. However, the related art structure is still subject to other problems. Since the piezoelectric oscillator according to the related art example has a larger number of terminals to be provided outside the package, the wiring inside and outside the package becomes complicated. Further, the data on the IC chip is rewritten by contacting a probe to the external terminal for data writing through a socket, etc. However, making a precise contact between the probe and the external terminal provided on the side of the package is difficult, and therefore the process yield rate may decrease because of the incapability in data writing due to poor contact. Furthermore, since the external terminal for data writing is placed on the side of the package and close to the mounting terminal, the solder between the mounting terminal on the piezoelectric oscillator and the mounting pattern on the substrate may cause a short circuit with the terminal on the side, leading to a malfunction of the piezoelectric oscillator. In addition, if the piezoelectric oscillator according to the above related art example is mounted on a substrate on which electronic parts are densely mounted, an electric signal, etc., may be added at a contact to other electronic parts, etc. due to the closeness with other electronic parts, etc. and cause an alteration of IC chip data.

SUMMARY

Exemplary embodiments provide a piezoelectric oscillator that does not trigger an accidental loss or alteration of data written in an IC chip (electronic part) and can facilitate the data writing into the IC chip, if needed, by reducing the number of terminals to be provided on a package. Further, the exemplary embodiments also provide an electronic device having the piezoelectric oscillator that solves or addresses the problems described above.

According to a first exemplary embodiment, a piezoelectric oscillator includes: a package having a package base, a bottom surface, a conductive cap that seals air tightly an interior space of the package base, and a terminal to perform at least one of inputting a signal from outside of the package and outputting a signal to the outside of the package; and a piezoelectric resonator element disposed in the package, an electronic part disposed in the package, the conductive cap being electrically coupled to the terminal to perform at least one of inputting a signal from the outside of the package and outputting a signal to the outside of the package, the terminal being provided on the electronic part; and a plurality of mounting terminals that are provided on the bottom surface of the package and electrically coupled to the electronic part. By electrically coupling the conductive cap to the terminal to perform at least one of inputting a signal from outside of the package and outputting a signal to the outside of the package, the terminal being provided on the electronic part, the number of terminals provided on the package base can be reduced, which further enables the reduction of mounting area on the piezoelectric oscillator and the simplification of package manufacturing process. Further, the contacting of the probe (probing) when writing information into the electronic part becomes easier. Furthermore, with a longer distance to the other terminals (mounting terminals), the short circuit between terminals can be effectively prevented.

In the piezoelectric oscillator having the above configuration, in an exemplary embodiment, the terminal to perform inputting a signal from the outside of the package and outputting a signal to the outside of the package is a terminal for writing information into the electronic part. By electrically coupling the conductive cap to the data writing terminal on the electronic part, the number of data writing terminals to be formed on the package base can be reduced, which further enables the reduction of both the mounting area and the size of the piezoelectric oscillator.

In the piezoelectric oscillator having the above configuration, in an exemplary embodiment, part of the plurality of mounting terminals are control terminals to write the information into the electronic part. With such a configuration, part of the mounting terminals provided on the bottom surface of the package can be used as terminals for writing information into the electronic part, and therefore the number of terminals to be provided outside the package can also be reduced.

Further, in the piezoelectric oscillator having the above configuration, in an exemplary embodiment, the conductive cap is a terminal for inputting a signal for switching the plurality of mounting terminals to the terminals to write the information into the electronic part. With such a configuration, the external terminal for writing data into the electronic part can also serve as a mounting terminal to mount the package on a substrate of an electronic device, etc. Therefore, the number of terminals to be provided outside the oscillator can be reduced. Further, by electrically coupling the conductive cap (a cap made of metal such as Kovar, etc., for example), which the related art has used for general purposes, to the data writing terminal on the electronic part so as to make the conductive cap part of the data writing terminal on the electronic part, the total number of terminals to be provided outside the package can be set as five. Hence, not only a terminal (CLK) for inputting a clock signal; a grounding terminal (GND); a terminal (DATA) for inputting data to be written in accordance with the clock signal; and a terminal ($V_{DD}$) to provide a power supply voltage, but also a terminal (PE) for inputting a signal that enables data writing into the electronic part can be set. Thus, when the PE has no signal input, there is no possibility of data alteration. Further, by allocating the functions of data writing terminals to the mounting terminals on the bottom surface of the package and the conductive cap on the top surface of the package, data rewriting to the electronic part can be performed easier even after the piezoelectric oscillator is mounted on a substrate of an electronic device, etc.

In the piezoelectric oscillator having the above configuration, in an exemplary embodiment, the electric coupling between the electronic part and the conductive cap is made through a via-hole that is provided in a laminated substrate configuring the package base. With such a configuration, the exposure of unnecessary wiring to the outside of the package can be eliminated, and thus the short circuit with other terminals can also be prevented.

Further, according to the second aspect of the exemplary embodiments, an electronic device includes the piezoelectric oscillator having the above configuration. Thus, electronic devices can be configured using the piezoelectric oscillator described above.

BRIEF DESCRIPTION OF THE DRAWINGS

The exemplary embodiments will be described with reference to the accompanying drawings, wherein like numbers refer to like elements, and wherein.

DETAILED DESCRIPTION OF EMBODIMENTS

Exemplary embodiments of a piezoelectric oscillator and an electronic device that includes the piezoelectric oscillator are described in detail below with reference to the accompanying drawings. In addition, the exemplary embodiments described below can be modified in various aspects without changing the essence of the invention.

Figure 1A:
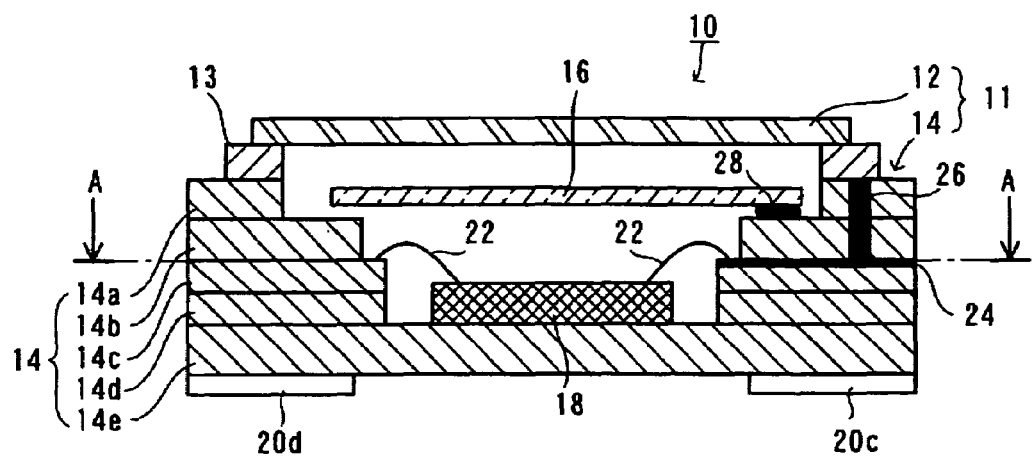
FIG. 1 is a schematic of a first exemplary embodiment of a piezoelectric oscillator.
Figure 1B:
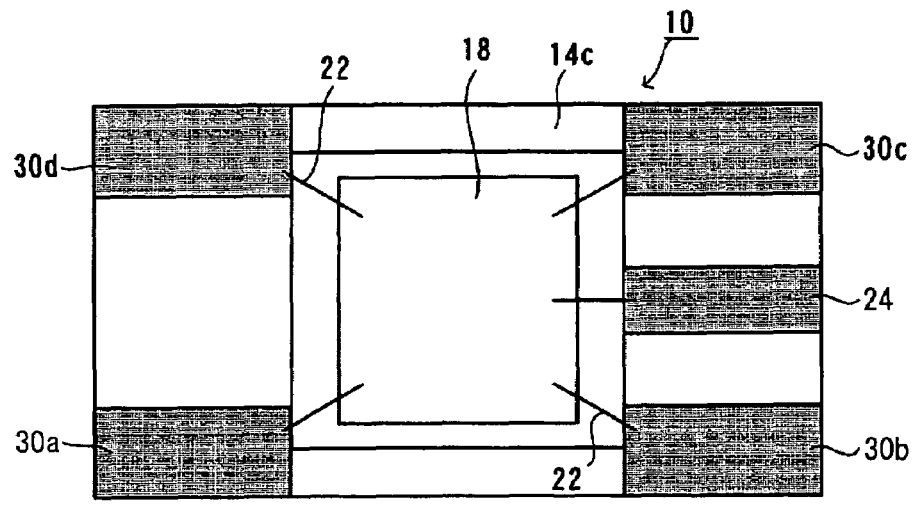
Figure 1C:
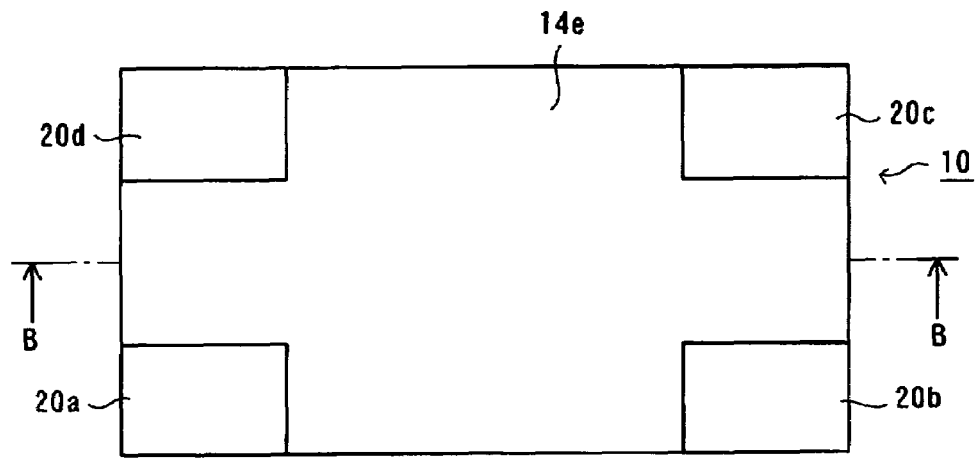

FIG. 1 is a schematic drawing showing a first exemplary embodiment of the piezoelectric oscillator. FIG. 1A is a sectional view, FIG. 1B is a sectional view taken along the plane A-A in FIG. 1A, and FIG. 1C is a bottom view. In addition, the side sectional elevation of FIG. 1A is a sectional view taken along the plane B-B in FIG. 1C.

The basic configuration of a piezoelectric oscillator 10 according to the first exemplary embodiment, which conforms to that of a general piezoelectric oscillator, includes a package base 14 made of an insulation material such as ceramic, etc., a cap 12 configuring a package 11 by sealing the opening of the package base 14, a piezoelectric resonator element 16 mounted in the space inside the package 11, and an electronic part 18 for controlling the behavior of the piezoelectric resonator element 16.

In the piezoelectric oscillator 10 having the above configuration, the package base 14 is configured in a square shape by laminating a plurality of substrates 14a to 14e that are formed by, for example, baking ceramic. In the first exemplary embodiment, the interior space of the package base 14 includes a space for mounting the electronic part 18, which extends upward and forming another space for mounting the piezoelectric resonator element 16 above the space for mounting the electronic part 18. Further, in the package base 14, various wiring patterns are formed as described later. Here, the electronic part 18 is bonded on the substrate 14e, which configures the package base, with a bonding material in between (not illustrated). Further, the piezoelectric resonator element 16 is bonded on the top surface of the substrate 14b with a conductive bonding material 28 in between.

At the bottom of the package base 14, mounting terminals 20 (20a to 20d) are provided for mounting the piezoelectric oscillator 10 on a substrate of an electronic device, etc., (not illustrated). The mounting terminals 20 are electrically coupled to the electronic part 18 mounted inside the package base 14, through the intermediaries of wiring patterns 30a to 30d, via-holes or castellations (not illustrated), and bonding wires 22, etc., all of which are placed in the package base 14.

The opening of the package base 14 is sealed by the conductive cap 12 (a cap made of metal such as Kovar, etc., for example), which is a conductive flat plate formed correspondingly to the opening of the package base 14, via a seal ring 13, which is made of a conductive material and formed on the top of the opening (on the top surface of the substrate 14a in FIG. 1). The sealing can be performed by way of heat sealing, which includes such methods as: melting the seal ring 13 with heat; and giving plating (Au—Sn, for example) on the conductive cap (cap) 12, the top surface of the package base 14, the surface of the seal ring 13, etc. and then melting such elements.

In the piezoelectric oscillator 10 having the above configuration, the electronic part 18 is electrically coupled to the conductive cap 12 through the intermediaries of a wiring pattern 24, a via-hole 26, and the seal ring 13, which are placed in the package base 14. Therefore, as described above, by performing heat sealing when sealing the package base 14 using the conductive cap 12, the chances of electric damage to the electronic part 18 given in the weld sealing process can be reduced or eliminated, unlike in the case of resistance welding, etc.

In the piezoelectric oscillator 10 configured as above, there are five terminals provided on the outside of the package 11: the mounting terminals 20a, 20b, 20c and 20d, and the conductive cap 12. On the other hand, a programmable piezoelectric oscillator usually requires a set of four terminals when used by users, including: a terminal (ST) for controlling whether or not to output a signal from the piezoelectric oscillator, a grounding terminal (GND), a terminal (OUT) for outputting the signal from the piezoelectric oscillator, and a terminal ($V_{DD}$) for providing a power supply voltage. Further, there is another set of four terminals required when the programmable piezoelectric oscillator is used by manufacturers for the purpose of writing information (a program) into the electronic part, including: a terminal (CLK) to which a clock signal is inputted, a grounding terminal (GND), a terminal (DATA) for inputting data synchronously with the clock signal, and a terminal ($V_{DD}$) for providing a power supply voltage. Therefore, in order to give all the above functions to the piezoelectric oscillator, the number of terminals to be provided outside the package will be six, including the terminals having the common functions of the power supply terminal ($V_{DD}$) and the grounding terminal (GND).

Hence, in the first exemplary embodiment, the functions of the four terminals required when used as a piezoelectric oscillator and the four terminals required when writing a program into the electronic part are shared among the mounting terminals 20 (20a to 20d).

The setting of functions for each of the mounting terminals 20 can be performed as follows. First, the functions of ST and CLK are allocated to the mounting terminal 20a. Second, the function of GND, which is a common function, is allocated to the mounting terminal 20b. Third, the functions of OUT and DATA are allocated to the mounting terminal 20c. Last, the other common function of $V_{DD}$ is allocated to the mounting terminal 20d.

In the piezoelectric oscillator 10, according to the first exemplary embodiment, a plurality of functions are allocated to each of the mounting terminals 20 as described above. Each mounting terminal 20 needs to be switchable between a mode having a function for users to use as the piezoelectric oscillator 10 and a mode having a function for manufacturers, etc. to use when writing a program into the electronic part. Therefore, in the piezoelectric oscillator 10, according to the first exemplary embodiment, the conductive cap 12 is electrically coupled to a data writing terminal (not illustrated) of the electronic part 18, as described above, so that the conductive cap 12 serves as a terminal (PE) for inputting a signal that enables program writing. With such an input signal terminal, the mounting terminals 20 function in the program writing mode when the signal potential to the PE is HIGH, and in the user mode (basic mode) when the signal potential is LOW. Hence, even if the number of terminals to be provided outside the piezoelectric oscillator 10 is five, the functions equivalent to six terminals can be allocated. Further, when the PE has no signal input, there is no possibility of data alteration.

Table 1 summarizes an example of function setting of the external terminals in the basic mode (for user's use) and in the program writing mode.

TABLE 1

| Terminal | Function for user's use | Function for program writing |
|---|---|---|
| Mounting terminal 20a | ST | CLK |
| Mounting terminal 20b | GND | GND |
| Mounting terminal 20c | OUT | DATA |
| Mounting terminal 20d | $V_{DD}$ | $V_{DD}$ |
| Conductive cap 12 | | PE |

Here, the electronic part 18 mounted on the piezoelectric oscillator having the above configuration is a circuit to control the piezoelectric resonator element 16 and takes the form of an integrated circuit (IC). Further, a temperature compensation circuit, a voltage control circuit, a memory, etc. are added to the electronic part 18 according to need. In addition, the piezoelectric resonator element 16 mounted on the piezoelectric oscillator 10 can be a tuning-fork piezoelectric resonator element, a surface acoustic wave resonant piece, etc. as well as an AT-cut piezoelectric resonator element.

Figure 2:
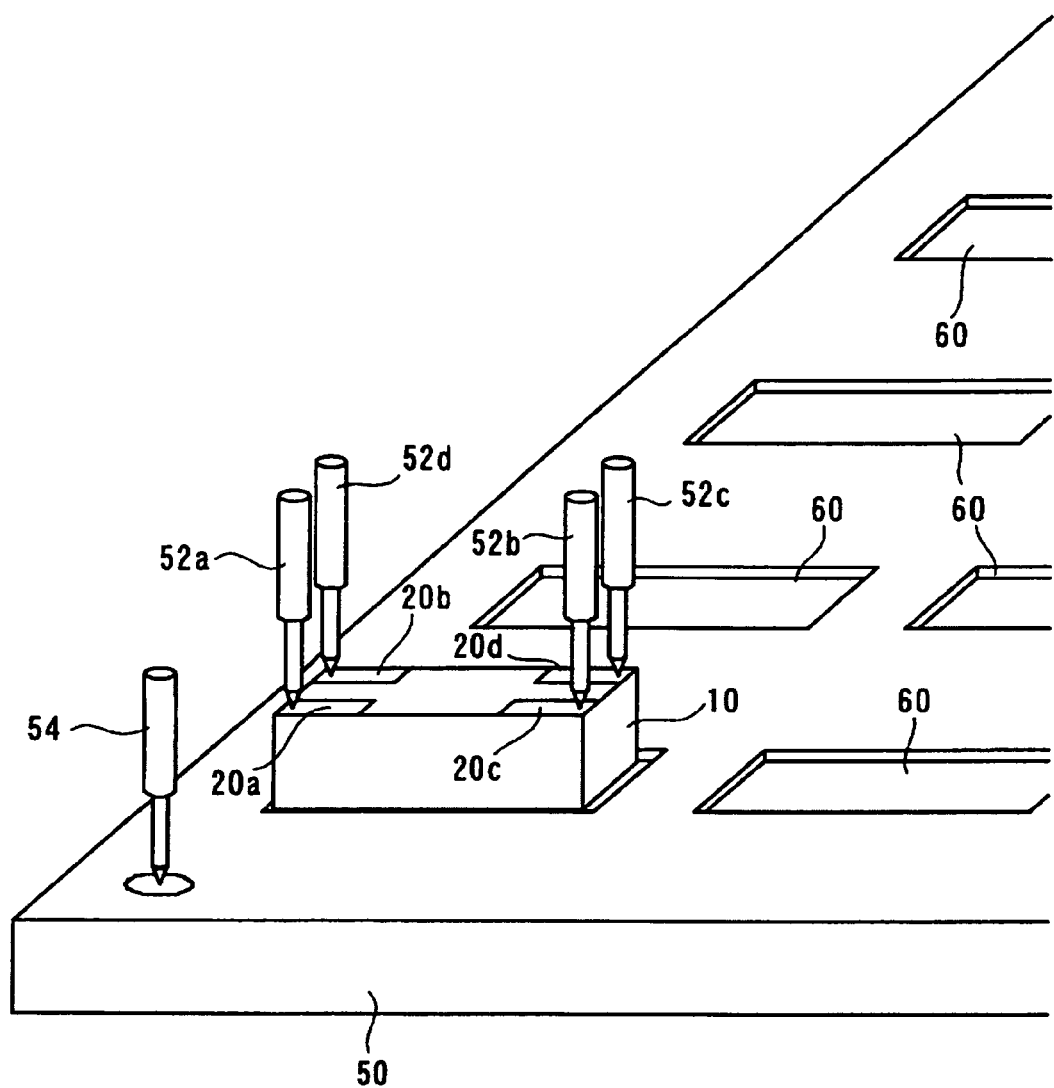
FIG. 2 is a schematic of an aspect in writing a program into an electronic part mounted on the piezoelectric oscillator according to the first exemplary embodiment.

In the piezoelectric oscillator 10 configured as described above, program writing into the electronic part 18 before mounting on a substrate can be performed by a method shown in FIG. 2. First, a tray (conductive tray) 50, which is a conductive flat plate, is prepared and the piezoelectric oscillator 10 is placed on the conductive tray 50, with the conductive cap 12 of the piezoelectric oscillator 10 contacted to the surface of the conductive tray 50. In addition, by forming concavities 60 on the layout surface of the conductive tray 50 in accordance with the layout of the piezoelectric oscillators 10, the interval between the piezoelectric oscillators 10 can be specified and the piezoelectric oscillators 10 can be lined up properly.

The piezoelectric oscillator 10 placed as described above exposes the four mounting terminals 20a to 20d at the top. In such a state, a signal is inputted by contacting a probe 54, which is for inputting a PE signal, to the conductive tray 50, on which the conductive cap 12 is contacted. Thus, the PE signal is transmitted to, in the order of, the probe 54, the conductive tray 50, the conductive cap 12, the seal ring 13, the via-hole 26, the wiring pattern 24, the bonding wire 22, and a program input terminal (not illustrated) of the electronic part, and then inputted into the electronic part.

Here, in the first exemplary embodiment, since the conductive cap 12 is set as a PE, the mounting terminals 20a to 20d function in the program writing mode while the PE has a signal input. In such a state, by contacting probes 52a to 52d, each of which has a function corresponding to each of the terminals, to each of the mounting terminals 20a to 20d and inputting program data into the electronic part (IC) 18, a program can be written into the IC 18 mounted on the piezoelectric oscillator.

In addition, by stopping the PE signal after the completion of program writing, the piezoelectric oscillator 10 returns to the user mode and the mounting terminals 20a to 20d regain the individual functions of ST, GND, OUT and $V_{DD}$.

By writing a program into the IC 18 of the piezoelectric oscillator 10 as described above, the PE signal can be inputted to the ICs 18 of the plurality of piezoelectric oscillators 10 placed on the conductive tray 50 using the single probe 54 that is contacted to the conductive tray 50. Therefore, in the case of mass production, the number of probes to be used for writing a program into the IC 18 can be reduced. Further, since probing is performed for the terminals facing upward, the work of probing becomes easier and the productivity becomes higher.

Next, the case of rewriting a program of the electronic part 18 after mounting the piezoelectric oscillator 10 having the above configuration onto a substrate of an electronic device (not illustrated), etc. will be described in detail. In such a case, a method shown in FIG. 3 can be employed. That is, if the conductive cap 12 is set as a PE, likewise the above case, the probe 54 for inputting a PE signal is contacted to the conductive cap 12. Here, signal input to the mounting terminals 20a to 20d can be performed by contacting the probes 52a to 52d having functions corresponding to individual wiring patterns 56a to 56d on which the mounting terminals 20a to 20d are mounted.

The input of a program is the same as the above case. By inputting a PE signal into the IC 18 via the conductive cap 12, the functions of the program writing mode are allocated to the individual mounting terminals 20a to 20d. Then, a signal is inputted correspondingly to each of the mounting terminals 20a to 20d via the wiring patterns 56a to 56d.

With the piezoelectric oscillator 10 according to the first exemplary embodiment that is configured as described above, part of the mounting terminals 20 and the conductive cap 12 being available as the terminals for inputting a program, the number of terminals that are exposed outside the package 11 can be reduced. Further, in a related art piezoelectric oscillator, with terminals being formed on the side of a package base, it has been difficult to contact a probe to the side terminal when data writing is performed after performing dense mounting on a substrate of an electronic device, etc., because of the closeness with other electronic parts, etc. However, using the piezoelectric oscillator 10 according to the first exemplary embodiment, a program can be written into the IC 18 not only before mounting on a substrate but even after performing dense mounting, other electronic parts, etc. being placed close to one another, because a probe can easily be contacted to the conductive cap 12 from above the piezoelectric oscillator 10.

Further, in the first exemplary embodiment, the switching between the program writing mode and the basic mode is performed using the PE terminal, wherein data to be written is inputted, during the operation in the program writing mode, to the PE terminal of the piezoelectric oscillator synchronously with the clock signal distributed from the outside of the piezoelectric oscillator to the CLK terminal of the piezoelectric oscillator. However, there is another data writing method. That is, the conductive cap 12 can be used as a PE terminal by: performing the switching between the program writing mode and the basic mode using a specifically patterned signal input into the PE terminal; and inputting the signal of data to be written, etc. through the PE terminal synchronously with an oscillation signal outputted by the piezoelectric oscillator. In other words, the mounting terminals 20 are used with the functions for user's use without any alteration, while a signal having the information of PE and DATA is inputted through the conductive cap 12. Table 2 summarizes an example of function setting of the external terminals in the above case.

TABLE 2

| Terminal | Function for user's use | Function for program writing |
| --- | --- | --- |
| Mounting terminal 20a | ST | |
| Mounting terminal 20b | GND | GND |
| Mounting terminal 20c | OUT | OUT (CLK) |
| Mounting terminal 20d | $V_{DD}$ | $V_{DD}$ |
| Conductive cap 12 | | PE, DATA |

Figure 3:
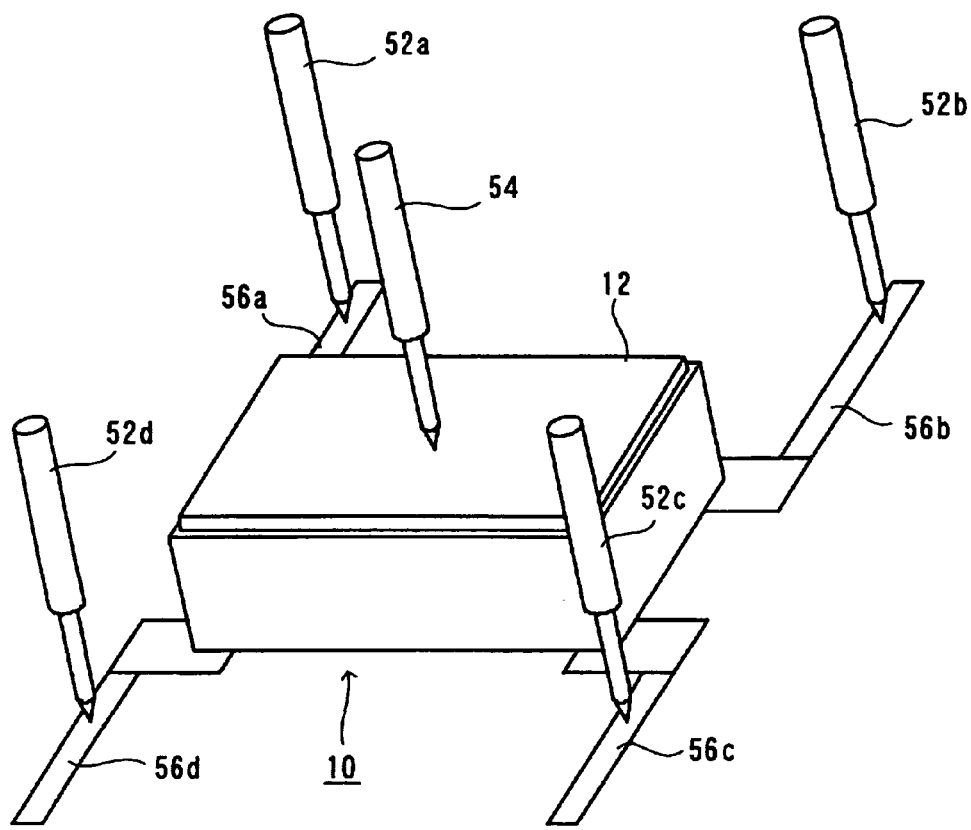
FIG. 3 is a schematic of another aspect in writing a program into an electronic part mounted on the piezoelectric oscillator according to the first exemplary embodiment.

Thus, data can be written into the electronic part 18 of the piezoelectric oscillator 10 only by contacting the probe solely to the conductive cap 12, with the piezoelectric oscillator operating in the basic mode, and inputting a signal. Further, the need for contacting the plurality of probes to the mounting substrate, as shown in FIG. 3, for the purpose of inputting the clock signal, the DATA signal, the PE signal, etc. is eliminated, and therefore data writing after mounting the substrate can be performed easily.

Figure 4:
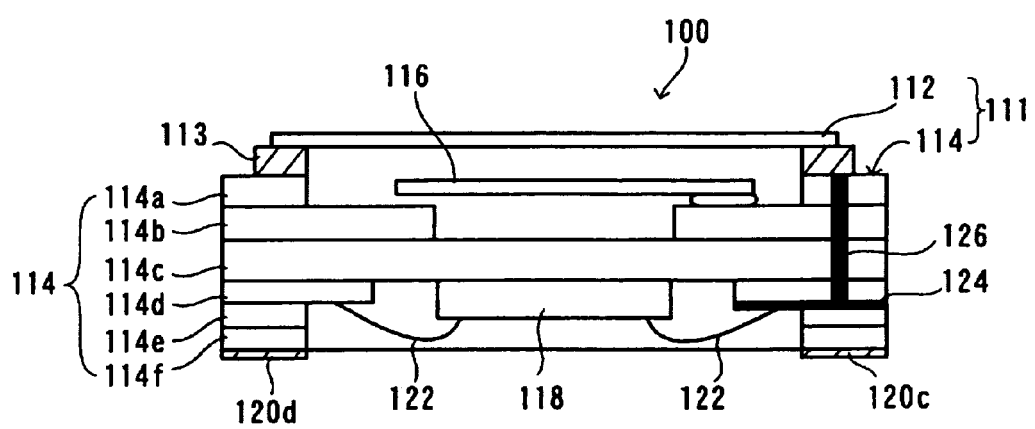
FIG. 4 is a schematic of a second exemplary embodiment of the piezoelectric oscillator.

Next, a second exemplary embodiment of the piezoelectric oscillator and a method for manufacturing the piezoelectric oscillator according to the exemplary embodiments will be described in detail with reference to FIG. 4.

The basic configuration of a piezoelectric oscillator according to the second exemplary embodiment, which is the same as that of the piezoelectric oscillator according to the first exemplary embodiment described above, includes a package that is configured of a conductive cap and a package base, as well as a piezoelectric resonator element and an electronic part that are mounted on the package. Therefore, the detailed description of the parts having elements equivalent to those of the first exemplary embodiment will be omitted, the reference numerals will be assigned based on adding 100 to the reference numerals used in FIG. 1.

The difference in a piezoelectric oscillator 100 according to the second exemplary embodiment from the piezoelectric oscillator 10 according to the first exemplary embodiment is that there are separate mounting spaces for a piezoelectric resonator element 116 and an electronic part 118. That is, the form of a package base 114 is changed. Specifically, the package base 114, which is configured of a plurality of laminated substrates 114a to 114f, has an H-shaped cross section, with the middle layer substrate 114c as a partition. On both principal surfaces of the partition, the mounting spaces for the piezoelectric resonator element 116 and the electronic part 118 are separately provided. The piezoelectric resonator element 116 is mounted in the space formed on one principal surface (the upper one in FIG. 4) of the package base 114 of the above shape, and the electronic part 118 is mounted in the space formed on the other principal surface (the lower one in FIG. 4). Of the two mounting spaces formed as above, the space in which the piezoelectric resonator element 116 is mounted is sealed airtightly using a conductive cap 112. On the other hand, the space in which the electronic part 118 is mounted can be molded using resin, etc.

The other configurations, functions and effects are almost the same as those of the first exemplary embodiment. The electronic part 118 and the conductive cap 112 are electrically coupled through the intermediaries of a bonding wire 122, a wiring pattern 124, a via-hole 126, and a seal ring 113.

In the first and the second exemplary embodiments, it has been described that, among the terminals provided outside the packages 11 and 111, the conductive caps 12 and 112 are set as the terminals for inputting a PE signal and that each of the mounting terminals 20a to 20d and 128a to 120d is set as each of the terminals for inputting the other signals. However, the setting of the above terminal functions is arbitrary. Even if the setting is changed, the effect of the first and the second exemplary embodiments does not change. In addition, in the first and the second exemplary embodiments, it has also been described that the longitudinal wiring in the package base is provided inside the package using a via-hole. However, instead of the via-hole, a castellation can be employed.

Figure 5:
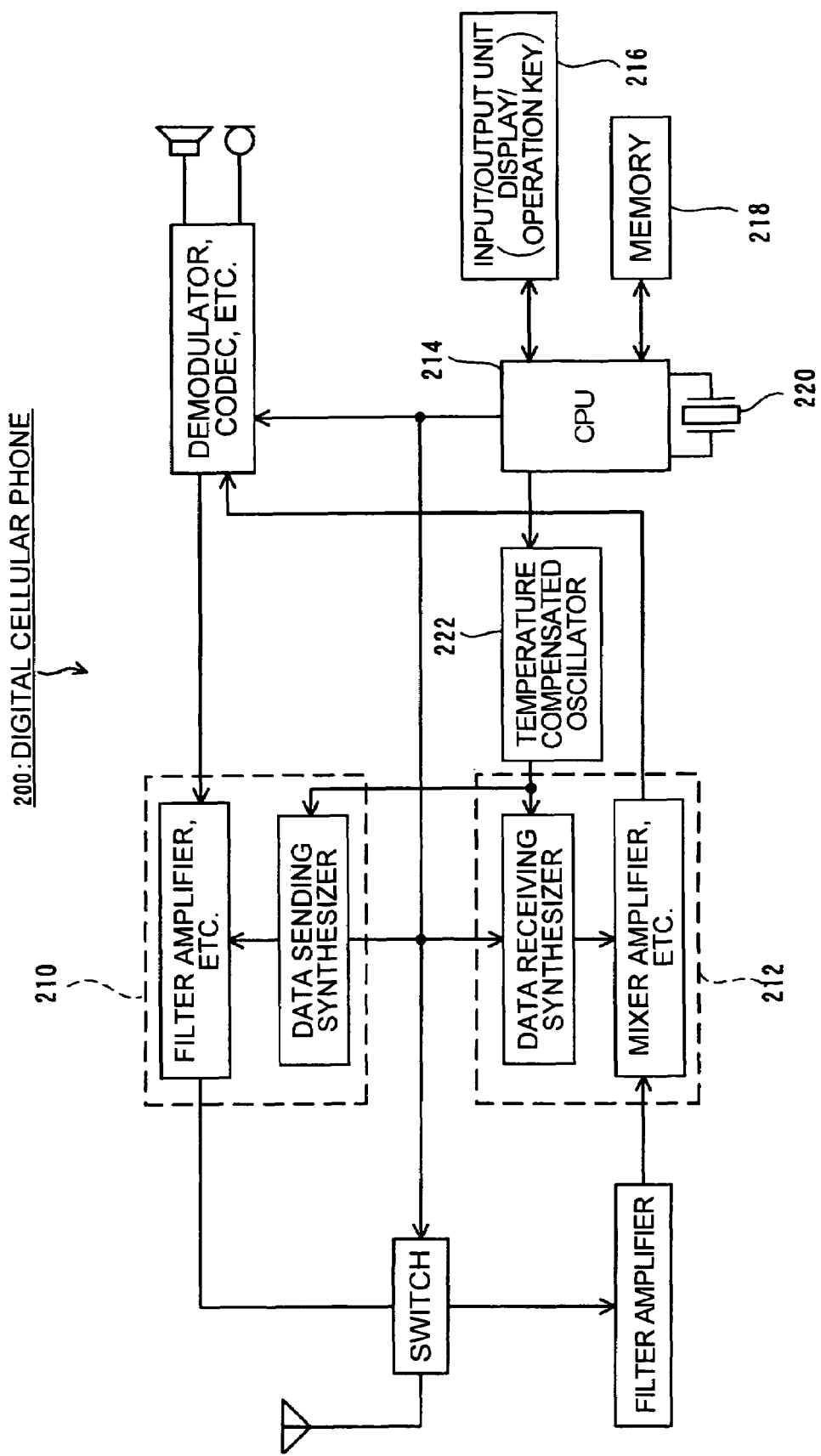
FIG. 5 is a schematic block diagram of a digital cellular phone.

An electronic device according to a third exemplary embodiment is based on an electronic device that acquires a clock signal for control purposes using a piezoelectric oscillator. Specifically, digital cellular phones, personal computers, workstations, personal digital [data] assistants (PDA), etc. that include the piezoelectric oscillator having the configuration described above can be named. As an example, a schematic block diagram of a digital cellular phone is shown in FIG. 5. A digital cellular phone 200 includes a sender unit 210 and a receiver unit 212 for sent and received signals, etc. To the sender unit 210 and the receiver unit 212, a central processing unit (CPU) 214 for controlling the two units is coupled. Further, the CPU 214 not only modulates and demodulates sent and received signals but also controls an input/output unit 216, which includes a display and operation keys for inputting information, etc., and a memory 218, which includes a RAM, a ROM, etc. Therefore, the CPU 214 is equipped with a piezoelectric device 220 so that the output frequency of the piezoelectric device 220 can be used as a clock signal suitable for each control method using a specific frequency divider (not illustrated), etc. build in the CPU 214. Further, the CPU 214 is coupled to a temperature compensated piezoelectric oscillator 222, and the temperature compensated piezoelectric oscillator 222 is coupled to the sender unit 210 and the receiver unit 212. Thus, a basic clock from the CPU 214 can be compensated, if varied with the change of environmental temperature, by the temperature compensated piezoelectric oscillator 222 and sent to the sender unit 210 and the receiver unit 212.

What is claimed is:

1. A piezoelectric oscillator, comprising:
a package having a package base, a bottom surface, a conductive cap that seals airtightly an interior space of the package base;
a piezoelectric resonator element disposed in the package;
an electronic part having a terminal to perform at least one of inputting a signal from outside of the package and outputting a signal to the outside of the package, the electronic part storing data;
the conductive cap being electrically coupled to the terminal of the electronic part;
a plurality of mounting terminals that are provided on the bottom surface of the package and electrically coupled to the electronic part; and
the electronic part storing the data that is input to one of the conductive cap and the plurality of mounting terminals.

2. The piezoelectric oscillator according to claim 1, the terminal to perform at least one of inputting the signal from outside of the package and outputting the signal to outside of the package being a terminal to write information into the electronic part.

3. The piezoelectric oscillator according to claim 1, a part of the plurality of mounting terminals being control terminals to write information into the electronic part.

4. The piezoelectric oscillator according to claim 1, the conductive cap being a terminal to input a signal to switch the plurality of mounting terminals to terminals to write information into the electronic part.

5. The piezoelectric oscillator according to claim 1, further comprising:
a laminated substrate configuring the package base;
a via-hole provided in the laminated substrate; and
an electric coupling between the electronic part and the conductive cap being made through the via-hole.

6. An electronic device, comprising:
the piezoelectric oscillator according to claim 1.

7. A piezoelectric oscillator, comprising:
a package having a package base, a bottom surface, a conductive cap that seals airtightly an interior space of the package base;
a piezoelectric oscillating piece disposed in the package;
an electronic part having a terminal to perform at least one of inputting a signal from outside of the package and outputting a signal to the outside of the package, the electronic part storing data;
the conductive cap being electrically coupled to the terminal of the electronic part;
a plurality of mounting terminals that are provided on the bottom surface of the package and electrically coupled to the electronic part, the plurality of mounting terminals having a data terminal that at least inputs the data; and
based on a signal input to the conductive cap, the electronic part further storing data that is input from the data terminal.

8. A piezoelectric oscillator, comprising:
a package having a package base, a bottom surface, a conductive cap that seals airtightly an interior space of the package base;
a piezoelectric oscillating piece disposed in the package;
an electronic part having a terminal to perform at least one of inputting a signal from outside of the package and outputting a signal to the outside of the package, the electronic part storing data;
the conductive cap being electrically coupled to the terminal of the electronic part, and the conductive cap being a terminal for inputting the data from the outside;
a plurality of mounting terminals that are provided on the bottom surface of the package and electrically coupled to the electronic part; and
the electronic part further storing the data input from the conductive cap.

* * * * *